United States Patent
Fatke et al.

(10) Patent No.: US 7,297,287 B2
(45) Date of Patent: Nov. 20, 2007

(54) METHOD AND APPARATUS FOR ENDPOINT DETECTION USING PARTIAL LEAST SQUARES

(75) Inventors: David Fatke, Austin, TX (US); Hongyu Yue, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 83 days.

(21) Appl. No.: 10/472,436

(22) PCT Filed: Mar. 25, 2002
(Under 37 CFR 1.47)

(86) PCT No.: PCT/US02/09073
§ 371 (c)(1),
(2), (4) Date: Sep. 7, 2004

(87) PCT Pub. No.: WO02/077589
PCT Pub. Date: Oct. 3, 2002

(65) Prior Publication Data
US 2005/0016947 A1    Jan. 27, 2005

Related U.S. Application Data

(60) Provisional application No. 60/277,981, filed on Mar. 23, 2001.

(51) Int. Cl.
*H01L 21/306* (2006.01)
(52) U.S. Cl. .............................. 216/59; 216/60; 438/7; 438/9; 438/14; 438/16; 438/689; 156/345.25
(58) Field of Classification Search ..................... None
See application file for complete search history.

(56) References Cited

U.S. PATENT DOCUMENTS 5,885,472 A    3/1999   Miyazaki et al.

(Continued)

FOREIGN PATENT DOCUMENTS

JP    63-093115    4/1988

(Continued)

OTHER PUBLICATIONS

Wangmaneerat et al "Plasma etching diagnostics for silicon nitride thin films using emission spectroscoy and multivariate calibration" proc. Electrochem. Soc. vol. 92-18, pp. 115-126, 1992.*

(Continued)

*Primary Examiner*—Anita Alanko
(74) *Attorney, Agent, or Firm*—Oblon, Spivak, McClelland, Maier & Neustadt, P.C.

(57) ABSTRACT

An apparatus and method for detection of a feature etch completion within an etching reactor. The method includes determining a correlation matrix by recording first measured data regarding a first etch process over successive time intervals to form a first recorded data matrix, assembling a first endpoint signal matrix using target endpoint data for a specific etch process, performing a partial least squares analysis on the recorded data matrix and the first endpoint signal matrix to refine the recorded data matrix, and computing a correlation matrix based upon the refined recorded data matrix and the first endpoint signal matrix. The method further includes performing a second etch process to form a second recorded data matrix. The correlation matrix and the second recorded data matrix are analyzed to determine whether an endpoint of the second etch process has been achieved.

26 Claims, 5 Drawing Sheets

U.S. PATENT DOCUMENTS

| | | | |
|---|---|---|---|
| 6,046,796 | A | 4/2000 | Markle et al. |
| 6,153,115 | A * | 11/2000 | Le et al. .................. 216/60 |
| 6,197,116 | B1 | 3/2001 | Kosugi |
| 6,586,262 | B1 | 7/2003 | Saito et al. |

FOREIGN PATENT DOCUMENTS

| | | |
|---|---|---|
| JP | 63-200533 | 8/1988 |
| JP | 03-181129 | 8/1991 |
| JP | 10/125660 | 5/1998 |
| JP | 2000-31985 | 11/2000 |

OTHER PUBLICATIONS

Chen, R. et al "Plasma etch modeling using optical emission spectroscopy" JVST A 14(3) May/Jun. 1996, pp. 1901-1906.*

Lee, S.F. et al "Prediction of wafer state after plasma processing using real-time tool data" IEEE Trans. on Semicond. Manufacturing, 8(3), pp. 252-261, Aug. 1995.*

Haaland, David M. et al "Partial Least-Squares Methods for Spectral Analysis. 1. Relation to Other Quantitative Calibration Methods and the Extraction of Qualitative Information" Anal. Chem., 1988, 60, 1193-1202.*

L. Tan et al.: "Steady-state regression analysis and optimization of multivariable plasma etching system" IECON Proceedings, vol. 3, pp. 1986-1991 Sep. 1994.

B. Wangmaneerat et al.: "Plasma etching diagnostics for silicon nitride thin films using emission spectroscopy and multivariate calibration" Proc.—Electrochem. Soc., vol. 92-18, pp. 115-126 1992.

S.F. Lee et al.: "Prediction of wafer state after plasma processing using real-time tool data" IEEE Transactions on Semiconductor Manufacturing, vol. 8, No. 3, pp. 252-261 Aug. 1995.

V. Dose: "Multivariate analysis of PECVD data" Appl. Phys. A, vol. A56, pp. 471-477 1993.

B. Wangmanerat et al., "Plasma Etching Diagnostics for Silicon Nitride Thin Films Using Emission Spectroscopy and Multivariate Calibration", Proc. - Electrochem. Soc., 1992, vol. 92-18, pp. 115-126.

* cited by examiner

METHOD AND APPARATUS FOR ENDPOINT DETECTION USING PARTIAL LEAST SQUARES

CROSS-REFERENCE TO RELATED APPLICATIONS

This application claims priority to International Application No. PCT/US02/09073, filed Mar. 25, 2002; which claims priority to U.S. Provisional Application Ser. No. 60/277,981, filed Mar. 23, 2001. The entire contents of these applications is incorporated herein by reference.

BACKGROUND OF THE INVENTION

1. Field of the Invention

The present invention relates generally to endpoint detection during semiconductor manufacturing.

2. Discussion of the Background

The inventors have identified problems with conventional processing reactors and methods of using those reactors that are solved by the present invention.

Typically, during semiconductor processing, a (dry) plasma etch process is utilized to remove or etch material along fine lines or within vias or contacts patterned on a silicon substrate. The plasma etch process generally involves positioning a semiconductor substrate with an overlying patterned, protective layer, for example a photoresist layer, into a processing chamber. Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, any exposed surfaces of the substrate are etched by the plasma. The process is adjusted to achieve optimal conditions, including an appropriate concentration of desirable reactant and ion populations to etch various features (e.g., trenches, vias, contacts, etc.) in the exposed regions of substrate. Such substrate materials where etching is required include silicon dioxide (SiO2), poly-silicon and silicon nitride.

As the feature size shrinks and the number and complexity of the etch process steps used during integrated circuit (IC) fabrication escalate, the requirements for tight process control become more stringent. Consequently, real time monitoring and control of such processes becomes increasingly important in the manufacture of semiconductor ICs. For example, one such monitoring and control diagnostic necessary for the timely completion of an etch step or process is endpoint detection.

Endpoint detection refers to the control of an etch step and, in particular, to the detection of the feature etch completion or the exact instant in time when the etch front reaches the etch stop layer. If the etch process endpoint is improperly detected, then severe under-cutting of the feature may occur due to over-etching or partially complete features may result due to underetching. As a result, poor endpoint detection could lead to devices of poor quality that are subject to increased risk of failure. Therefore, the accurate and precise completion of an etch process is an important area for concern during the manufacturing process.

One approach used for endpoint detection is to monitor the emission intensity of light at a pre-specified wavelength in time using optical emission spectroscopy (OES). Such a method might identify a wavelength corresponding to a chemical species present in the etch process that shows a pronounced transition at the etch process endpoint. Subsequently, a resultant signal is analyzed to detect distinct variations in the emission intensity which, and the analysis of the resulting signal is then used to correlate with the completion of an etch process. Typically, the species selected corresponds to a reactive species or a volatile etch product. For example, the selected wavelength may correspond to $CO^*$ emission when etching $SiO_2$ and polymer films, $N_2^*$ or $CN^*$ emission when etching nitride films, $SiF^*$ emission when etching poly-silicon and $AlCl^*$ emission when etching aluminum.

In addition to the approach of monitoring the emission intensity at a single wavelength as described above, another approach is to monitor the light intensity at two wavelengths and record the ratio (or some mathematical manipulation thereof) of the two intensities. For instance, one wavelength is chosen for a specie whose concentration decays at an endpoint and a second wavelength is chosen for a specie whose concentration increases at the endpoint. Therefore, the ratio gives improved signal to noise.

However, as the IC device sizes have decreased, and the exposed open areas have correspondingly decreased, single and dual wavelength endpoint detection schemes have found limited use due to their reduced robustness for extracting a low signal-to-noise (S/N) endpoint signal from the process. Subsequently, process engineers have been presented with the formidable challenge of selecting the right wavelengths with sufficient robustness in a manufacturing environment and, as a result, more sophisticated endpoint detection schemes have arisen. The sophisticated endpoint detection schemes sample data at thousands of wavelengths (i.e. a broad emission spectrum is recorded at each instant in time during the etch process) and multivariate data analysis techniques such as Principal Component Analysis (PCA) are applied to extract the endpoint signal.

In PCA, several techniques, including eigenvalue analysis, singular value decomposition (SVD), and nonlinear partial least-squares (NiPALS) have been employed to identify the principal directions in the multi-dimensional space, where the variance in the data scatter is greatest. The dimension of the multi-dimensional space is equivalent to the number of variables recorded, i.e. the number of discrete wavelengths of the emission intensity are recorded. And therefore, PCA will identify the directions in the multi-dimensional space where the variations in the emission intensity are greatest. In other words, the principal component acts as a series of weighting coefficients for each variable. Typically, the first three or four principal components (corresponding to the three or four largest eigenvalues) are selected and employed for deriving the three or four endpoint signals from the newly recorded data. However, a shortcoming of the use of PCA for multivariate analysis of optical emission data includes the mathematical rigor and complexity such an analysis entails, and, more importantly, the lack of use of physical criteria associated with the etch process to extract a reduced set of data including the endpoint signal(s).

Therefore, what is needed is an improved apparatus and method for endpoint detection which overcomes the shortcomings identified above.

SUMMARY OF THE INVENTION

Accordingly, the present invention advantageously provides an apparatus and a method for improved detection of a feature etch completion.

An embodiment of the present invention advantageously provides a method including the steps of determining a correlation matrix by recording first measured data regarding a first etch process over successive time intervals to form a first recorded data matrix, assembling a first endpoint signal matrix using target endpoint data for a specific etch process, performing a partial least squares analysis on the first recorded data matrix and the first endpoint signal matrix to refine the first recorded data matrix, and computing a correlation matrix based upon the refined recorded data matrix and the first endpoint signal matrix. The method further includes performing a second etch process to form a second recorded data matrix, where the correlation matrix and the second recorded data matrix are analyzed to determine whether an endpoint of the second etch process has been achieved.

The preferred embodiment of the method of the present invention is defined such that the step of performing a partial least squares analysis includes the steps of calculating variable importance in projection data defined as an influence on the first endpoint signal matrix of the first measured data, and refining the first recorded data matrix based upon an analysis of the variable importance in projection data. The step of refining the first recorded data matrix includes analyzing the variable importance in projection data to determine if a variable within the first recorded data matrix can be eliminated as having minimal impact on the first endpoint signal matrix. The variable used discarded during refinement can be defined as having a variable importance in projection data value below a predetermined threshold value, or within a predetermined range. Alternatively, the refinement can be defined such that at least a first derivative of a variable importance in projection data value with respect to a variable number is used to select a threshold value for the variable importance in projection data below which the variable is discarded.

The preferred embodiment of the method is defined such that the step of performing a second etch process includes the steps of initiating the second etch process within a processing chamber, recording second measured data regarding the second etch process over successive time intervals to form the second recorded data matrix of at least one recorded data vector, calculating at least one endpoint signal by multiplying the at least one recorded data vector and at least one weighting vector of the correlation matrix, determining whether the endpoint has been achieved by inspecting the at least one end point signal, and stopping the etch process when the endpoint has been achieved.

In the preferred embodiment, the first etch process and the second etch process are performed within a single processing chamber. The correlation matrix is preferably calculated for a selected etch process performed within a selected processing chamber. The target data is preferably determined by experimentation within a selected processing chamber, and the selected processing chamber is utilized for the second etch process. In the preferred embodiment, the measured data is optical emission data, however alternatively the measured data can be electrical signal data and/or match network capacitor setting data.

In the preferred embodiment, the first recorded data matrix, the first endpoint signal matrix, and the correlation matrix are defined by a relationship:

$$\overline{X}\overline{B}=\overline{Y},$$

where $\overline{X}$ represents the first recorded data matrix having m by n data points, $\overline{B}$ represents the correlation matrix having n by p data points, and $\overline{Y}$ represents the first endpoint signal matrix having m by p data points. The data of a given instant in time within the first recorded data matrix and the second recorded data matrix is preferably mean-centered by computing a mean value of elements in a column of a respective matrix and subtracting the mean value from each element, or normalized by determining a standard deviation of data in a column of a respective matrix.

An embodiment of the present invention advantageously provides an apparatus including an etching reactor configured to perform an etch process therein, where the etch process is driven by a power source connected to the etching reactor, and an end-point detector for detecting an endpoint of the etching process. The end-point detector includes a detecting section configured to sequentially detect data relating to the etch process within the etching reactor. The endpoint detector further includes a calculating section configured to determine a correlation matrix using first measured data regarding a first etch process over successive time intervals to form a first recorded data matrix, assemble a first endpoint signal matrix using target endpoint data for a specific etch process, perform a partial least squares analysis on the first recorded data matrix and the first endpoint signal matrix to refine the first recorded data matrix, compute a correlation matrix based upon the refined recorded data matrix and the first endpoint signal matrix, and form a second recorded data matrix for a second etch process. The calculating section is configured to analyze the correlation matrix and the second recorded data matrix and produce an endpoint signal when an endpoint of the second etch process has been achieved. The apparatus further includes a controller configured to receive the endpoint signal from the calculating section, and the controller is configured to control a drive of the power source based upon the endpoint signal.

The preferred embodiment of the apparatus of the present invention is configured such that the detecting section includes a photodetector configured to sequentially detect an emission spectrum within the etching reactor. The photodetector section preferably includes a high resolution optical emission spectroscopy sensor. The etching reactor preferably includes a vacuum chamber having a view window made of transparent material throughwhich the detecting section detects the emission spectrum.

The preferred etching reactor is a capacitively coupled plasma reactor including a vacuum chamber, a pair of parallel plate electrodes provided within the vacuum chamber, a gas injection line connected to the vacuum chamber, and a gas exhaust line connected to the vacuum chamber, wherein the power source is a high frequency power source connected to one of the pair of parallel plate electrodes. Alternatively, the etching reactor can be a multi-frequency capacitively coupled plasma reactor, an inductively coupled plasma reactor, an electron cyclotron resonance reactor, or a helicon plasma reactor.

In the preferred embodiment, the calculating section is configured to calculate variable importance in projection data defined as an influence on the first endpoint signal matrix of the first measured data, and refine the first recorded data matrix based upon an analysis of the variable importance in projection data. The calculating section is preferably configured to refine the first recorded data matrix by analyzing the variable importance in projection data to determine if a variable within the first recorded data matrix can be eliminated as having minimal impact on the first endpoint signal matrix.

In alternative embodiments, the detecting section is configured to sequentially detect electrical signal data and/or match network capacitor setting data relating to the etch process within the etching reactor.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DESCRIPTION OF THE PREFERRED EMBODIMENTS

As stated above, the inventors have identified problems with conventional processing reactors and methods of using those reactors that are solved by the present invention. Therefore, the present invention provides an improved apparatus and method for endpoint detection which overcomes the shortcomings identified with regard to the conventional processing reactors.

The inventors recognized that it is difficult to accurately detect the endpoint for the etch process of a small open area substrate. As the device sizes shrink, the open area shrinks and consequently the endpoint signal and the signal-to-noise ratio are reduced. What is needed is a simplified multivariate analysis approach for extracting endpoint signal(s) utilizing known physical criteria set by the etch process.

Additionally, the inventors have recognized that it is difficult to repeatedly detect the endpoint for an etch process from wafer-to-wafer. The endpoint detection algorithm must be robust enough to overcome wafer-to-wafer variability in the process conditions. What is needed is a robust algorithm requiring minimal to no operator interaction from wafer-to-wafer.

The inventors have recognized that it is important to select the wavelengths that contain the most informative endpoint signals. As described above, conventional multivariate analysis techniques employed to extract an endpoint signal are mathematically complex and rigorous, and do not include information regarding the process to extract the signal. In PCA, only several principal components are selected for endpoint signal extraction from the data, however the criteria used to select these components can be ad hoc. Therefore, what is needed is a method of selecting important wavelengths and assigning weights utilizing informed decisions based upon the etch process physics. What is needed is set of physical criteria for making informed decisions regarding the selection and removal of wavelengths from the emission spectrum.

The present invention will now be described with reference to preferred embodiments that provide advantageous structures and methods that overcome the problems identified by the inventors which are described above.

Figure 1:
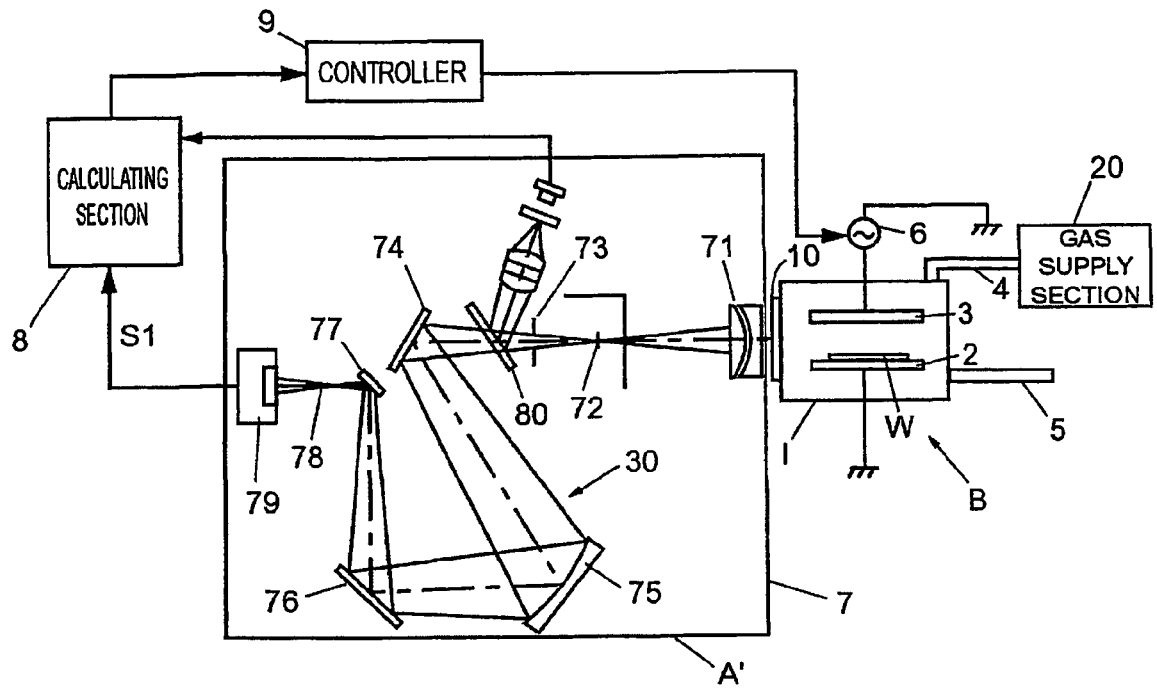
FIG. 1 depicts a plasma etching reactor and an end-point detector for detecting an endpoint of an etching process according to an embodiment of the present invention.

Referring now to the drawings, FIG. 1 depicts a plasma etching reactor or device B and an end-point detector A' for detecting an endpoint of an etching process, which is processed by the plasma etching device B. The plasma etching device B preferably includes a vacuum process chamber 1 that is formed of a conductive material, such as aluminum, and a pair of parallel plate electrodes 2 and 3 that are provided in the upper and lower portions of the vacuum chamber 1. The electrodes 2 and 3 are provided within the vacuum chamber 1 such that the electrodes 2 and 3 have a predetermined spacing. A gas injection line 4 and a gas exhaust line 5 are connected to the vacuum process chamber 1. The gas injection line 4 is employed to introduce a fluorocarbon (e.g., CF series, such as $CF_4$) etching gas into the vacuum chamber 1 from an etching gas supply section 20. The gas exhaust line 5 is used to evacuate unused process gas and reaction effluent generated in the vacuum chamber 1 through a vacuum pump to an outer exhaust handling unit (e.g., an abatement system) of the vacuum chamber 1.

The lower electrode 2 is formed on a bottom surface of the vacuum chamber 1 to be used as a base for mounting a processing object, such as a semiconductor substrate or wafer W. The lower electrode 2 is preferably a ground electrode and the upper electrode 3 is connected to a high frequency power source 6. As described earlier, the introduction of process gas into the vacuum process chamber 1 and the application of power to the electrode 3 activate a processing plasma P, whereby a reactant and ion population is formed suitable for etching the patterned material film on the wafer W.

The vacuum process chamber 1 depicted and described herein is a capacitively coupled plasma (CCP) reactor. However, as will be readily apparent to one of ordinary skill in the art, the present invention is applicable to multi-frequency CCP reactors, inductively coupled plasma (ICP) reactors, electron cyclotron resonance (ECR) reactors and plasma reactors of the helicon type without deviating from the material discussed herein.

A thin and long view window 1a, which is preferably extended in a horizontal direction, is attached to a part of a peripheral surface of the vacuum process chamber 1. The view window 1a is formed of a transparent material such as quartz glass, and can transmit the emission spectrum of plasma P, which is generated in the vacuum process chamber 1, therethrough. In order to detect an advanced state of the etching process of the semiconductor wafer W, the emission spectrum of plasma P, which is passed through the view window 1a, is guided to the endpoint detector A' for detecting the endpoint of the plasma etching.

The endpoint detector A' preferably includes a photo detector 7 and a calculating section 8. The photo detector 7 sequentially detects the emission spectrum of the plasma P emitted from the view window 1a of the vacuum process chamber 1 to be photoelectrically transferred. The calculating section 8 calculates an advanced state of the etching based on a detection signal of the photo detector 7 sent to the calculating section 8 via line S1. The calculating section 8 is configured to send an electrical signal, for example upon detection of an endpoint, to a controller 9. The controller 9 controls the drive of the high frequency power source 6 based on the electrical signal sent from the calculating section 8. According to the above-mentioned structure, the etching process, which is suitable for a predetermined pattern, is provided to a surface of the semiconductor wafer W until the endpoint of the etching is detected by the endpoint detector A'.

The photodetector 7 preferably includes an aberration corrected lens 71 for converging the emission spectrum of the plasma P emitted from the view window 1a of the vacuum process chamber 1, an incident slit 72, which is provided at a focal point of the aberration corrected lens 71, and a diaphragm 73 for reducing the emission spectrum passed through the incident slit 72. Moreover, the photodetector 7 includes a first optical system 30 that includes a reflection mirror 74 for reflecting the emission spectrum sent from the diaphragm 73, a concave surface diffraction grating 75 for receiving a reflected light sent from the reflection mirror 74, and a first light receiving sensor 79. The first light receiving sensor 79 receives a first-order diffracted light having a specific wavelength sent from the concave surface diffraction grating 75 through reflection mirrors 76, 77 and through an emission slit 78 so as to be photoelectrically transferred. In order that the first-order diffracted light sent from the concave surface diffraction grating 75 is amplified to largely capture the change of an activated species, which is a reaction product in etching (e.g., CO* in a case of etching a silicon oxide film), the first light-receiving sensor 79 preferably includes a photo-multiplier tube that photoelectrically amplifies the received-light.

The concave surface diffraction grating 75 is formed such that the light-receiving angle can be changed. Therefore, when the light receiving angle of the grating 75 is set at a predetermined angle, the first-order diffraction light having a specific wavelength can be emitted to the first light receiving sensor 79 through the reflection mirrors 76 and 77 and the emission slit 78. Moreover, if the grating 75 is sequentially rotated, the emission intensity at discrete wavelength increments can be sequentially recorded and a broad emission spectrum can be assembled. The increment resolution is dependent upon the spectrometer design (e.g., several Angstroms).

In general, the photodetector 7 hardware (spectrometer) includes a light dispersion mechanism (e.g., grating, etc.) and/or a wavelength selection device (e.g., filter, etc.), a light detector (e.g., CCD line array, CID line array, photo-multiplier tube, etc.), and a computer processor to record the measured emission spectrum. An example of a photodetector, and the assembly thereof, is described in U.S. Pat. No. 5,888,337. An alternative example of photodetector includes a high resolution OES sensor configured for endpoint detection, for example a high resolution OES sensor from Peak Sensor Systems. Such an OES sensor has a broad spectrum that spans the ultraviolet (UV), visible (VIS) and near infrared (NIR) light spectrums. The resolution is approximately 1.4 Angstroms, for example the sensor is capable of collecting 5550 wavelengths from 240 to 1000 nm. The sensor is equipped with high sensitivity miniature fiber optic UV-VIS-NIR spectrometers which are, in turn, integrated with 2048 pixel linear CCD arrays. The spectrometers receive light transmitted through single and bundled optical fibers, where the light output from the optical fibers is dispersed across the line CCD array using a fixed grating. Similar to the configuration described above, light emitting through an optical vacuum window is focussed onto the input end of the optical fibers via a convex spherical lens. Three spectrometers, each specifically tuned for a given spectral range (UV, VIS and NIR), form a sensor for a process chamber. Each spectrometer includes an independent A/D converter. And lastly, depending upon the sensor utilization, a full emission spectrum can be recorded every 0.1 to 1.0 seconds.

Figure 2:
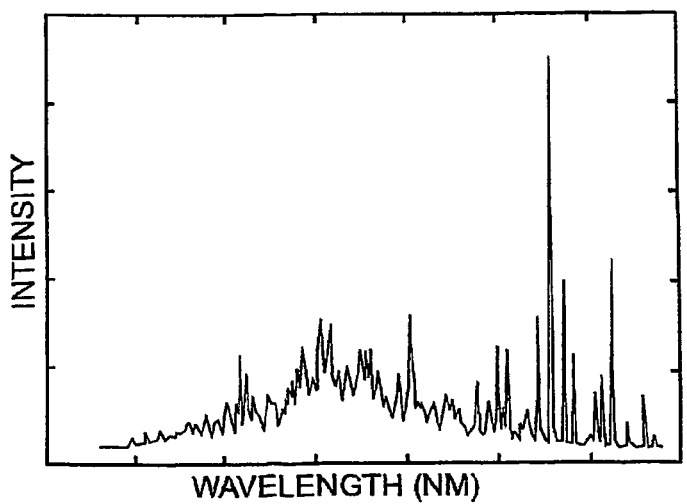
FIG. 2 depicts an emission spectrum recorded from 240 nm to 1000 nm using the device depicted in FIG. 1.

FIG. 2 presents a typical emission spectrum recorded from 240 nm to 1000 nm using the above-defined device. The emission intensity is related to the amount of a specific specie present in the plasma above the wafer and the wavelength as noted in FIG. 2 is indicative of the atomic/molecular specie. An emission spectrum such as that depicted in FIG. 2 can include a record of the emission intensity at, for example, 1024 discrete wavelengths and the emission spectrum can be recorded, for example, every second for an etch process. Therefore, if the etch process is approximately two minutes in length, then 120 separate emission spectrums are recorded. In other words, the operator records a time trace 120 seconds in length of the emission intensity at 1024 discrete wavelengths in the UV-VIS NIR spectrum.

The data received by the photodetector 7 is transferred to the calculating section 8, where the data is recorded and stored digitally on a processor within calculating section 8. Each emission spectrum at an instant in time is stored as a row in a matrix $\overline{X}$ and, hence, once the matrix $\overline{X}$ is assembled, each row represents a different instant in time and each column represents a different emission intensity for a given wavelength. Hence, for this example, matrix $\overline{X}$ is a rectangular matrix of dimensions 120 by 1024, or more generally, m by n. Once the data is stored in the matrix, the data is preferably mean-centered and/or normalized, if desired. The process of mean-centering the data stored in a matrix column involves computing a mean value of the column elements and subtracting the mean value from each element. Moreover, the data residing in a column of the matrix is normalized by determining the standard deviation of the data in the column.

The following description discusses the methods by which an endpoint signal(s) is extracted from the data stored in the matrix $\overline{X}$.

The initial phase of the method begins with the selection of weighting coefficients for endpoint signal extraction. Prior to utilizing the endpoint detection algorithm with an actual etch process in the manufacturing environment, a set of loading coefficients must be defined which relate the large set of emission spectrum data to the endpoint signal(s). In general, for multivariate analysis, the relationship between the measured data and the endpoint signal is expressed as follows $$\overline{X}\overline{B}=\overline{Y} \qquad (1)$$

where $\overline{X}$ represents the m by n matrix described above, $\overline{B}$ represents an n by p (p<n) loading (or correlation) matrix and $\overline{Y}$ represents an m by p matrix containing the endpoint signals. Typically, when using PCA, the loading matrix $\overline{B}$ includes the eigenvectors corresponding to the three or four largest eigenvalues of the covariance matrix $\overline{X}^T\overline{X}$ (superscript "T" denotes transpose) as columns, where the number of eigenvectors retained (e.g., three or four) defines the dimension p. However, unlike all other attempts to utilize multivariate analysis (such as PCA) for endpoint detection, the partial least squares (PLS) method of the present invention employs known or predetermined endpoint data for a specific etch process as target data to "force" the endpoint signal ("scores" matrix $\overline{Y}$), and therefrom derive the weighting coefficients ("loading" matrix $\overline{B}$) by PLS analysis.

Figure 3A:
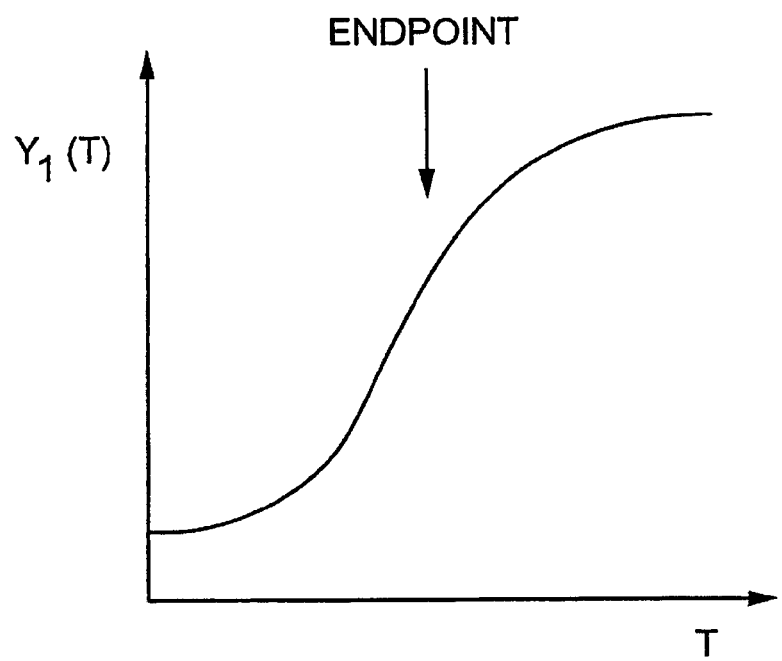
FIG. 3A depicts a first endpoint signal $y_1(t)$.
Figure 3B:
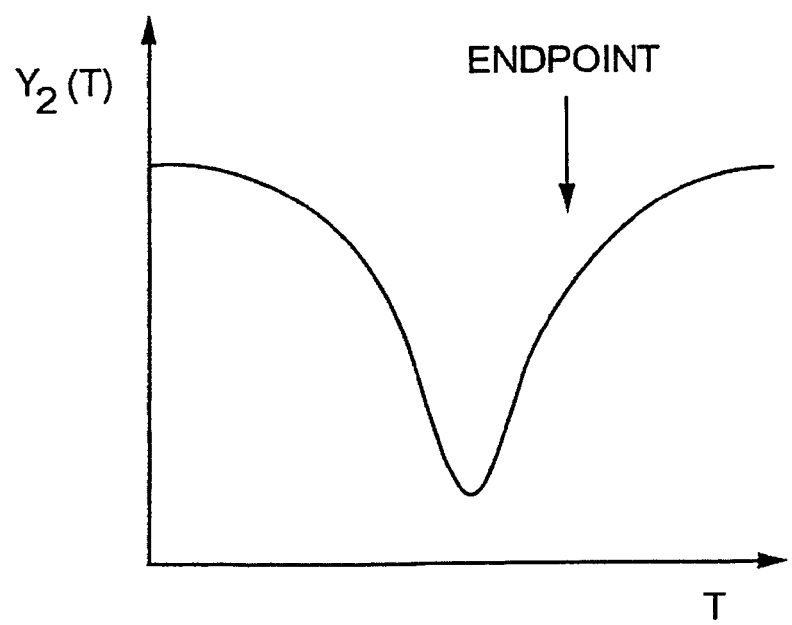
FIG. 3B depicts a second endpoint signal $y_2(t)$.

For instance, two such endpoint signals are depicted in FIGS. 3A and 3B. FIG. 3A presents a first endpoint signal $y_1$, (t) which may be represented as an m by 1 matrix or column vector $\overline{y_1}$, stored in the first column of $\overline{Y}$, and FIG. 3B presents a second endpoint signal $y_2$(t) which may be represented as an m by 1 matrix or column vector $\overline{y_2}$, stored in the second column of $\overline{Y}$, viz.

$$\overline{Y}=[\overline{y_1},\overline{y_2}] \tag{2}$$

In this case, the endpoint signal matrix $\overline{Y}$ includes two columns, however, the endpoint signal matrix $\overline{Y}$ may be expressed more generally as having a column dimension of p, or p endpoint signals. The target endpoint signals employed to "force" the initial definition of the matrix $\overline{Y}$ have been determined from significant experience obtained in studying the emission spectrum properties of a particular etch process. This initial definition of the endpoint signal will now be used to "train" the endpoint detection model (i.e., the formation of the loading matrix $\overline{B}$) how to extract a robust endpoint signal from a large set of optical emission data. Furthermore, the endpoint signals or columns in matrix $\overline{Y}$ may be adjusted in order to optimize the relationship between the optical emission data and the endpoint signals for the most robust model.

Therefore, following the example set above for matrix $\overline{X}$ and using the endpoint signals set for matrix $\overline{Y}$ depicted in FIGS. 3A and 3B described above, matrix $\overline{X}$ will have dimensions of 120 by 1024, matrix $\overline{B}$ will have dimensions of 1024 by 2, and matrix $\overline{Y}$ will have dimensions 120 by 2.

Once the data matrix $\overline{X}$ and the endpoint signal matrix $\overline{Y}$ are assembled, a relationship designed to best approximate the $\overline{X}$ and $\overline{Y}$ spaces and to maximize the correlation between $\overline{X}$ and $\overline{Y}$ is established using PLS analysis.

In the PLS model, the matrices $\overline{X}$ and $\overline{Y}$ are decomposed as follows:

$$\overline{X}=\overline{T}\overline{P}^T+\overline{E}; \tag{3a}$$

$$\overline{Y}=\overline{U}\overline{C}^T+\overline{F}; \tag{3b}$$

and $$\overline{U}=\overline{T}+\overline{H}; \tag{3c}$$

where $\overline{T}$ is a matrix of scores that summarizes the $\overline{X}$ variables, $\overline{P}$ is a matrix of loadings for matrix $\overline{X}$, $\overline{U}$ is a matrix of scores that summarizes the $\overline{Y}$ variables, $\overline{C}$ is a matrix of weights expressing the correlation between $\overline{Y}$ and $\overline{T}(\overline{X})$, and $\overline{E}$, $\overline{F}$ and $\overline{H}$ are matrices of residuals. Furthermore, in the PLS model, there are additional loadings $\overline{W}$ called weights that correlate $\overline{U}$ and $\overline{X}$, and are used to calculate $\overline{T}$. In summary, the PLS analysis geometrically corresponds to fitting a line, plane or hyper plane to both the $\overline{X}$ and $\overline{Y}$ data represented as points in a multidimensional space, with the objective of well approximating the original data tables $\overline{X}$ and $\overline{Y}$, and maximizing the covariance between the observation positions on the hyper planes.

Figure 4:
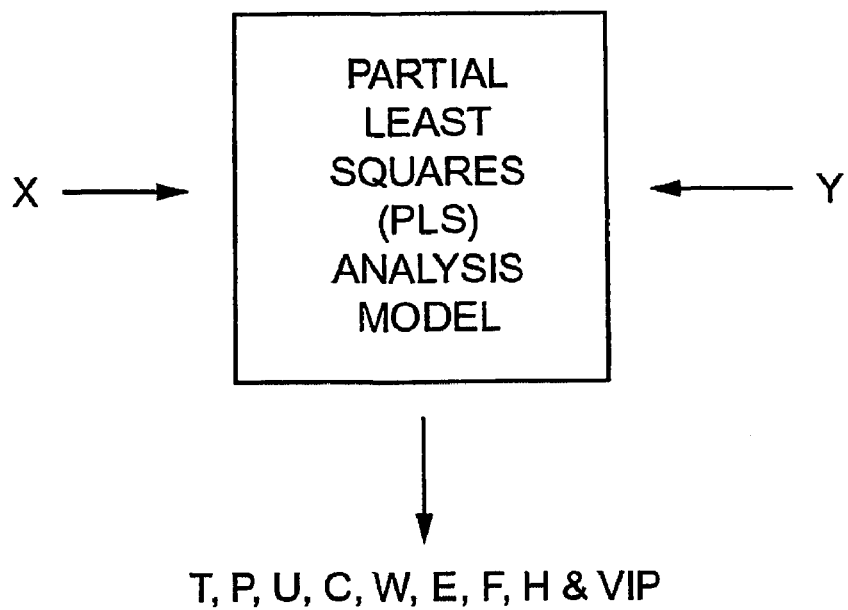
FIG. 4 is a schematic representation of data inputs to the partial least squares analysis of an embodiment of the present invention, and corresponding outputs.

FIG. 4 provides a schematic representation of the data inputs, $\overline{X}$ and $\overline{Y}$, to the PLS analysis and the corresponding outputs $\overline{T}$, $\overline{P}$, $\overline{U}$, $\overline{C}$, $\overline{W}$, $\overline{E}$, $\overline{F}$, $\overline{H}$ and variable importance in the projection (VIP). An example of a commercially available software which supports PLS modeling is SIMCA-P 8.0. For further details on this software see the User's Manual (User Guide to SIMCA-P 8.0: A new standard in multivariate data analysis, Umetrics AB, Version 8.0, September 1999).

Once the PLS analysis is complete and the above output matrices have been computed, the influence on the $\overline{Y}$ matrix of every term or column in the $\overline{X}$ matrix, namely, the VIP is determined. VIP is the sum over all model dimensions of the contributions variable influence (VIN). For a given PLS dimension, $(VIN)_{ij}^2$ is related to the squared PLS weight $(w^{ij})^2$ of that term. The accumulated (over all PLS dimensions) value, $$VIP_{\cdot j} = \sum_i (VIN)_{\cdot j}^2, \tag{4}$$

is used for further analysis. Once the VIPs are computed for each variable in matrix $\overline{X}$, they may be sorted and plotted in descending order against the variable number. Those variables with the largest VIP will have the greatest impact on the endpoint signals in matrix $\overline{Y}$.

Figure 5:
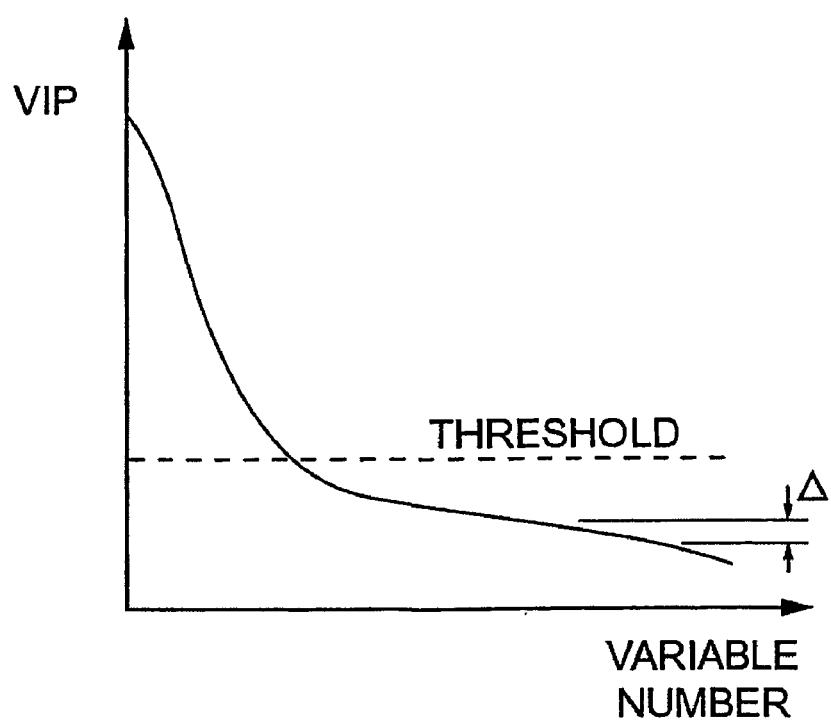
FIG. 5 depicts an exemplary plot of a variable importance in the projection (VIP) values versus variable number values.

FIG. 5 depicts an exemplary plot of the VIPs versus the variable number. From FIG. 5, one may assess the relative significance of a given variable on the endpoint signals $\overline{Y}$, and thereby refine the data matrix $\overline{X}$ by reducing the variable dimension n of the original data matrix $\overline{X}$. Exemplary criterion used to discard the variables of minimal impact or little significance to the endpoint signal include: (1) discard those variables whose VIP falls less than a pre-specified threshold; (2) discard those variables associated with VIPs in the lowest $10^{th}$ percentile or within some other predetermined range (or, in other words, retain those variables associated with the largest VIP in the top $90^{th}$ percentile; note that the percentile threshold or range selected can be different from the 90/10 embodiment described herein); and (3) the first, second or higher derivative of the VIP with respect to the variable number may be used to select a value for the VIP, below which those variables are discarded (i.e., a maximum in the first or second derivative, or when the first derivative becomes less than a predetermined threshold slope).

Using any one of the above-mentioned criteria, one may then discard those variables that have minimal impact on the endpoint signal(s). This data reduction or refinement, in turn, reduces the column space of the data matrix $\overline{X}$ from p (1024 in the above example) to q (e.g., 50 variables), and forms a "new", reduced or refined data matrix $\overline{X}^*$ of dimensions m by q (120 by 50); now an over-determined system following equation (1). Once an initial data reduction has taken place, one may store those variables (i.e. identify those discrete wavelengths) important for endpoint detection. Thereafter, further refinement or reduction of the data matrix $\overline{X}^*$ can be performed and/or the method can proceed with re-computing the output matrices from the PLS model using the reduced data matrix $\overline{X}^*$ and determining the matrix $\overline{B}$ for establishing the relationship between the data measured at the stored discrete wavelengths and the endpoint signal(s).

At this point, the PLS model is repeated following the schematic presented in FIG. 4, except now the reduced matrix $\overline{X}^*$ is used as the input to the PLS analysis. The output matrices are then recomputed. As stated above, the VIPs may be studied following the description associated with FIG. 5 to further refine the data matrix $\overline{X}^*$, or the matrix $\overline{B}$ may be evaluated from the output data using the relationship:

$$\overline{B}=\overline{W}(\overline{P}^T\overline{W})^{-1}\overline{C}^T. \qquad (5)$$

Once the data matrix $\overline{X}^*$ has been optimized, a final pass through the PLS analysis is generally required to update or re-compute the output matrices necessary for computing the matrix $\overline{B}$. Hereinafter, the evaluation of equation (5) leads to a set of weighting coefficients to be used for extracting the endpoint signal from the sampled data matrix.

The above discussion provides one embodiment of a method of determining the matrix $\overline{B}$, where two endpoint signals $\overline{y_1}$ and $\overline{y_2}$ are used as starting points. However, the PLS model can alternatively be executed with one or more initial endpoint signals assembled in matrix $\overline{Y}$ that are, in turn, subject to adjustment in order to improve or optimize the relationship between the data matrix $\overline{X}$ and the endpoint signals $\overline{Y}$. Adjustments to the endpoint signals can include adjustments of the endpoint signal shape, the position of the inflection point as in FIG. 3A, or the position of the signal minimum as in FIG. 3B.

The above embodiment describes the assembly of data matrix $\overline{X}$ from optical emission signals, however other chamber signals sampled over specified time periods at specified rates can alternatively be utilized. For example, other chamber signals such as electrical signals or match network capacitor settings can be used in addition to or in place of the optical data, and stored as separate columns in the matrix $\overline{X}$.

Figure 6:
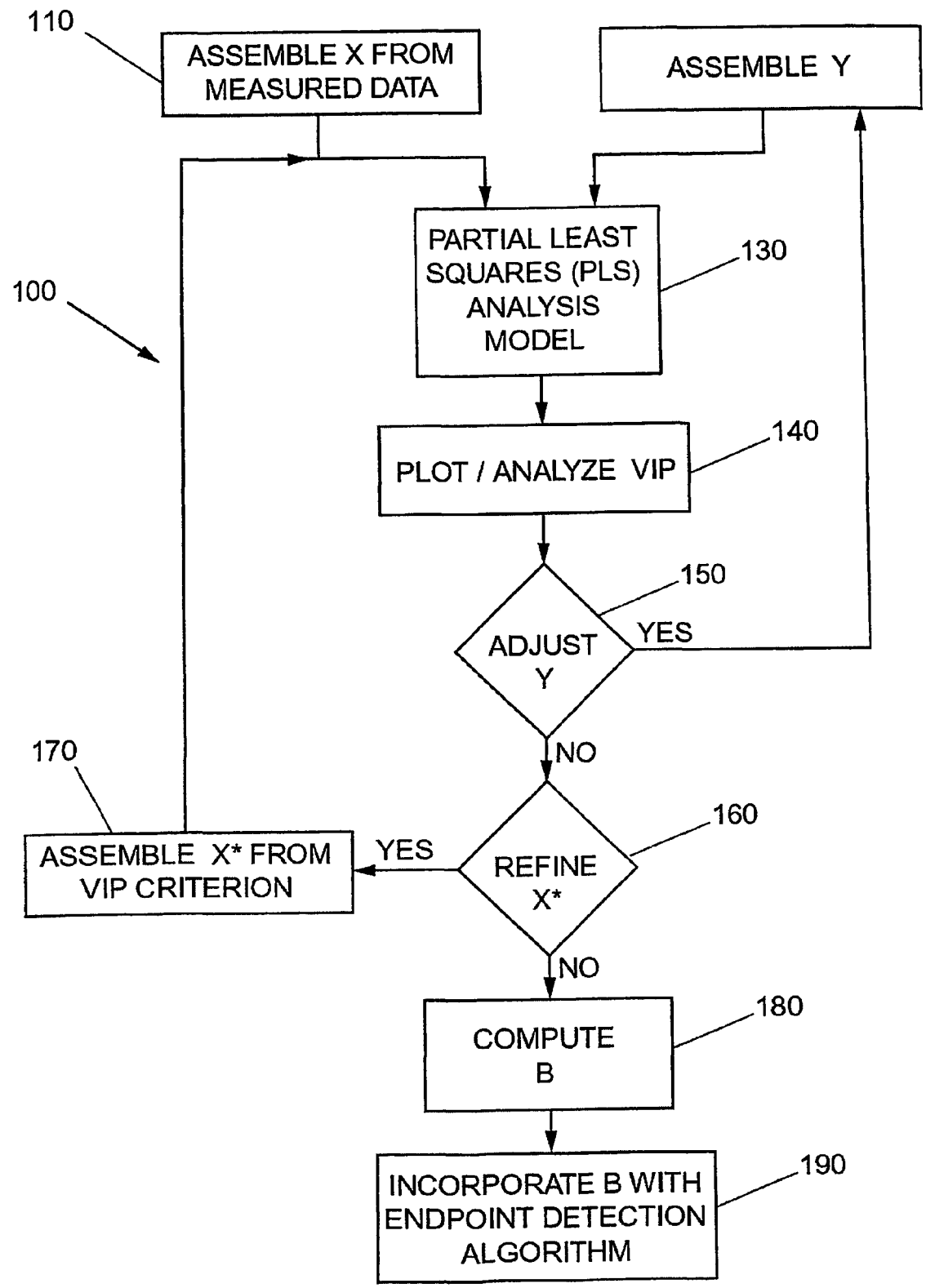
FIG. 6 is a flow diagram of a method for determining a weighting coefficient according to an embodiment of the present invention.

The procedures 100 performed by the calculating section 8 for determining the weighting coefficients are presented in FIG. 6. In step 110, the matrix $\overline{X}$ is assembled from the measured optical emission data (and/or other data such as electrical signals, match network capacitor settings, etc.), where each column represents a time trace of each measured variable. Then in step 120, the matrix $\overline{Y}$ is assembled with projected endpoints, where each column represents an endpoint signal such as that depicted in FIGS. 3A and 3B. In step 130, matrices $\overline{X}$ and $\overline{Y}$ are input into the PLS analysis model to compute the above described weighting, loading, variable influence and score matrices. Step 140 includes plotting and analyzing the variable importance in projection (VIP) data (sorted and plotted in descending order as in FIG. 5). And step 150 determines whether, given the results from the PLS analysis, adjustments to the projected endpoint signal matrix $\overline{Y}$ are required. If so, the matrix $\overline{Y}$ is re-assembled with the changes and the $\overline{X}$ and $\overline{Y}$ matrices are re-entered into the PLS analysis. If not, the analysis proceeds to step 160. Step 160 determines whether the matrix $\overline{X}$ is to be refined (i.e. reduced), and, if so, then repeats the PLS analysis following step 170 with the new data matrix $\overline{X}^*$ in order to re-compute the corresponding new weighting, loading, variable influence, and score matrices. In step 170, the criterion described in association with the VIP information presented in FIG. 5 are utilized to reduce the matrix $\overline{X}$ to a new matrix $\overline{X}^*$, where the reduced matrix has discarded those variables (columns) deemed unimportant for the endpoint signal (i.e., there is a weak correlation or minimal impact between the data variable and the endpoint signal(s)). Once it has been determined that matrix $\overline{X}^*$ is finalized, step 180 is performed. Step 180 includes computing the correlation matrix $\overline{B}$ from equation (5) for later use in an actual endpoint detection process. And step 190 includes incorporating the correlation matrix $\overline{B}$ with the endpoint detection algorithm used for an etch process.

Once the correlation matrix $\overline{B}$ has been evaluated, the correlation matrix $\overline{B}$ can be used as part of an endpoint detection algorithm to provide robust determination of the etch process endpoint with minimal variability from wafer-to-wafer and from wafer lot-to-wafer lot. The endpoint detection algorithm can, in general, be applied to a variety of etch processes, however, the specific correlation matrix $\overline{B}$ developed as described above will be specific to a particular process in a specific reactor. For example, oxide etching may be performed in a reactor much like that described in FIG. 1. With reference to FIG. 1, a CCP etch reactor was described where a wafer is set atop a grounded lower electrode (or chuck electrode) while an upper electrode is powered to generate a processing plasma once the process gas is introduced to the vacuum chamber. A typical process gas chemistry for oxide etch can include a specie mix of $C_4F_8/CO/O_2/Ar$. As stated above, the dissociation and ionization of this gas mixture leads to an etch chemistry suitable for reacting with the preferred material (e.g., $SiO_2$).

Once the etch process is activated following the ignition of a plasma, the endpoint monitoring system including optical emission sensors, as described above, and/or other electrical measurement devices begin to record data at a pre-specified rate. For instance, the optical emission sensors are capable of recording the emission spectrum every 0.1 to 1.0 second. A preferred sampling rate is one Hertz (Hz). The monitoring system is instructed to record those signals most important to the endpoint signal as described in the material supporting FIG. 6. For example, in order to reduce the data scan time and data storage requirements, the charge-coupled device (CCD) line array used to detect the dispersed light spectrum from the plasma reactor may be replaced with a charge-injection device (CID) line array, where only those elements (or pixels) are recorded that pertain to wavelengths of light deemed important (unlike the CID array, all elements in the CCD array must be read). Once a scan of optical emission data (and/or other data signals) is complete for one instant in time during the etch process, a row is filled in the data matrix $\overline{X}$. Using the calculating section 8 of the hardware in FIG. 1 and following equation (5), the row vector of data matrix $\overline{X}$ is projected onto the one or more weighting (column) vectors stored in matrix $\overline{B}$ in order to compute one data point in the one or more endpoint signals. As the etch process proceeds and data (rows in matrix $\overline{X}$) are filled, the one or more endpoint signals are evolved in time, much like those in FIGS. 3A and 3B. As these endpoint signals are evolved in time, the means for detecting the endpoint in such a signal will be implemented such as those depicted in FIGS. 3A and 3B.

Figure 7:
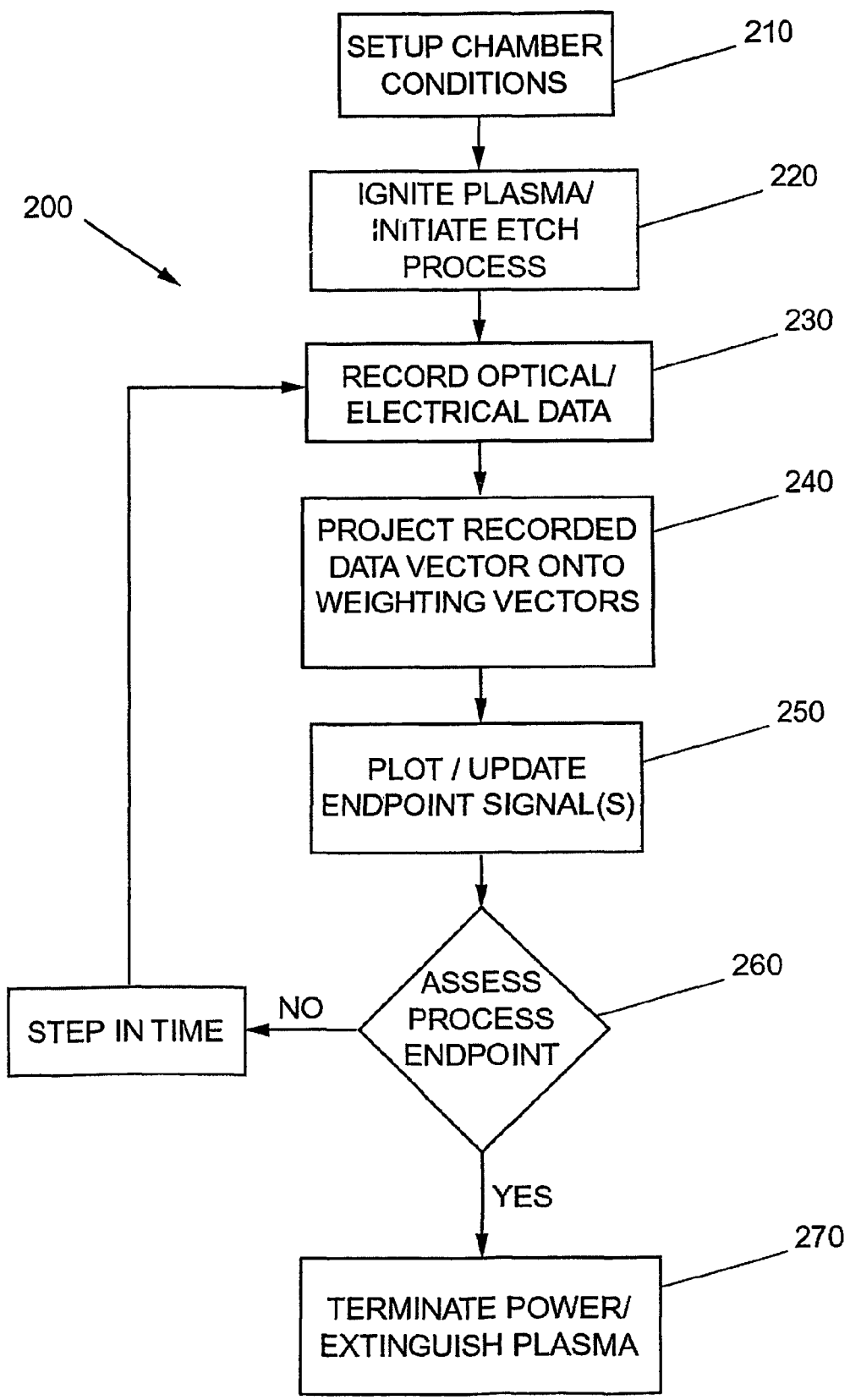
FIG. 7 is a flow diagram of a method for monitoring and detecting an endpoint of an etch process according to an embodiment of the present invention.

FIG. 7 presents the typical steps 200 utilized for monitoring and detecting the end of an etch process according to the present invention. The method generally begins with step 210 by setting up the chamber conditions for the etch process. For example, the chamber setup includes loading the substrate to be processed, pumping down the vacuum chamber (for example, the vacuum chamber as depicted in FIG. 1) to a base pressure, initiating the flow of process gas, and adjusting the vacuum pump throttle valve to establish the chamber process pressure. In step 220, the plasma is ignited via the application of RF power to the upper electrode as discussed with reference to FIG. 1, thereby initiating the etch process. Step 230 includes recording a second set of measured data at a first instant in time. During the data sampling, the data will be recorded at second, . . . , nth instants in time, until an endpoint is reached. Step 240 includes projecting the recorded data vector (each variable serves as a vector dimension) onto the one or more weighting vectors via vector multiplication (or matrix multiplication). Step 250 includes plotting and updating (if necessary) the one or more endpoint signals. The plots will look much like that presented in FIGS. 3A and 3B as they evolve in time. In Step 260, it is determined from inspection of the endpoint signal(s), whether an endpoint has been achieved. If the endpoint has been achieved, then the method proceeds with step 270. If the endpoint has not been achieved, then the method continues with the etch process and sampling of the measured data at regular intervals (e.g., every 1 second). In step 270, the endpoint has been achieved and, at this point, the RF power applied to the upper electrode is shut down by controller 9, the plasma is extinguished, and the etch process is brought to an abrupt stop.

The present invention advantageously provides an apparatus and a method where an existing or artificial signal is used to set the target for endpoint detection. Further advantageously, the wavelengths with the most relevant endpoint signal are selected and utilized to determine the endpoint signals. Additionally, the present invention provides an apparatus and a method where several types of endpoint signals can be utilized, such as endpoint signals with different shapes. By changing the target, different signal patterns can be extracted.

The present invention further advantageously provides an apparatus and a method that utilizes PLS analysis. PLS analysis not only tries to extract signals with large variance, but also finds those signals that correlate most with the target variables. Other methods use PCA and other factor analysis methods that do not have a target. The extracted signal by PCA may or may not contain endpoint information. To the contrary, the PLS analysis of the present invention forces the model to learn the pattern in matrix $\overline{Y}$ (i.e., the endpoint detection signal(s)). PCA may not give you an endpoint signal, while the use of PLS analysis directly correlates OES data with the endpoint signal and maximizes the possibility to extract endpoint pattern.

Numerous modifications and variations of the present invention are possible in light of the above teachings. It is therefore to be understood that, within the scope of the appended claims, the invention may be practiced otherwise than as specifically described herein.

The invention claimed is:

1. A method for detection of a feature etch completion, the method comprising:
   determining a correlation matrix by:
   recording first measured data regarding a first etch process over successive time intervals to form a first recorded data matrix,
   assembling a first endpoint signal matrix using predetermined target endpoint data as an indicator of an endpoint for a specific etch process,
   performing a partial least squares analysis on the first recorded data matrix and the first endpoint signal matrix to refine the first recorded data matrix,
   computing said correlation matrix based upon the refined recorded data matrix and the first endpoint signal matrix; and
   performing a second etch process to form a second recorded data matrix, wherein the correlation matrix and the second recorded data matrix are analyzed to determine whether an endpoint of the second etch process has been achieved.

2. The method according to claim 1, wherein said performing a partial least squares analysis includes:
   calculating variable importance in projection data defined as an influence on the first endpoint signal matrix of the first measured data; and
   refining the first recorded data matrix based upon an analysis of the variable importance in projection data.

3. The method according to claim 2, wherein the refining the first recorded data matrix comprises analyzing the variable importance in projection data to determine if a variable within the first recorded data matrix can be eliminated as having minimal impact on the first endpoint signal matrix.

4. The method according to claim 3, wherein the variable having a variable importance in projection data value below a predetermined threshold value is discarded.

5. The method according to claim 3, wherein the variable having a variable importance in projection data value within a predetermined range is discarded.

6. The method according to claim 3, wherein at least a first derivative of a variable importance in projection data value with respect to a variable number is used to select a threshold value for the variable importance in projection data below which the variable is discarded.

7. The method according to claim 1, wherein said performing a second etch process comprises the steps of:
   initiating the second etch process within a processing chamber;
   recording second measured data regarding the second etch process over successive time intervals to form the second recorded data matrix of at least one recorded data vector;
   calculating at least one endpoint signal by multiplying the at least one recorded data vector and at least one weighting vector of the correlation matrix;
   determining whether the endpoint has been achieved by inspecting the at least one end point signal; and
   stopping the etch process when the endpoint has been achieved.

8. The method according to claim 1, wherein the first etch process and the second etch process are performed within a single processing chamber.

9. The method according to claim 1, wherein the correlation matrix is calculated for a selected etch process performed within a selected processing chamber.

10. The method according to claim 1, wherein the target data is determined by experimentation within a selected processing chamber, and wherein the selected processing chamber is utilized for the second etch process.

11. The method according to claim 1, wherein the measured data is optical emission data.

12. The method according to claim 1, wherein the measured data is electrical signal data.

13. The method according to claim 1, wherein the measured data is match network capacitor setting data.

14. The method according to claim 1, wherein the first recorded data matrix, the first endpoint signal matrix, and the correlation matrix are defined by a relationship:

$$\overline{X}\overline{B}=\overline{Y},$$

where $\overline{X}$ represents the first recorded data matrix having m by n data points, $\overline{B}$ represents the correlation matrix having n by p data points, and $\overline{Y}$ represents the first endpoint signal matrix having m by p data points.

15. The method according to claim 1, wherein data of a given instant in time within the first recorded data matrix and the second recorded data matrix is mean-centered by computing a mean value of elements in a column of a respective matrix and subtracting the mean value from each element.

16. The method according to claim 1, wherein data of a given instant in time within the first recorded data matrix and the second recorded data matrix is normalized by determining a standard deviation of data in a column of a respective matrix.

17. An apparatus comprising:
an etching reactor configured to perform an etch process therein, said etch process being driven by a power source connected to said etching reactor;
an end-point detector for detecting an endpoint of said etching process, said end-point detector comprising a detecting section and a calculating section, said detecting section being configured to sequentially detect data relating to the etch process within said etching reactor, said calculating section being configured to determine a correlation matrix using first measured data regarding a first etch process over successive time intervals to form a first recorded data matrix, assemble a first endpoint signal matrix using predetermined target endpoint data as an indicator of an endpoint for a specific etch process, perform a partial least squares analysis on the first recorded data matrix and the first endpoint signal matrix to refine the first recorded data matrix, compute said correlation matrix based upon the refined recorded data matrix and the first endpoint signal matrix, and form a second recorded data matrix for a second etch process, wherein said calculating section is configured to analyze the correlation matrix and the second recorded data matrix and produce an endpoint signal when an endpoint of the second etch process has been achieved; and
a controller configured to receive said endpoint signal from said calculating section, said controller being configured to control said power source based upon said endpoint signal.

18. The apparatus according to claim 17, wherein said detecting section comprises a photodetector configured to sequentially detect an emission spectrum within said etching reactor.

19. The apparatus according to claim 18, wherein said photodetector section comprises a high resolution optical emission spectroscopy sensor.

20. The apparatus according to claim 18, wherein said etching reactor includes a vacuum chamber having a view window made of transparent material through which said detecting section detects the emission spectrum.

21. The apparatus according to claim 17, wherein said etching reactor is a capacitively coupled plasma reactor including a vacuum chamber, a pair of parallel plate electrodes provided within said vacuum chamber, a gas injection line connected to said vacuum chamber, and a gas exhaust line connected to said vacuum chamber, wherein said power source is a high frequency power source connected to one of said pair of parallel plate electrodes.

22. The apparatus according to claim 17, wherein said etching reactor is selected from a group consisting essentially of a multi-frequency capacitively coupled plasma reactor, an inductively coupled plasma reactor, an electron cyclotron resonance reactor, and a helicon plasma reactor.

23. The apparatus according to claim 17, wherein said calculating section is configured to calculate variable importance in projection data defined as an influence on the first endpoint signal matrix of the first measured data, and refine the first recorded data matrix based upon an analysis of the variable importance in projection data.

24. The apparatus according to claim 23, wherein said calculating section is configured to refine the first recorded data matrix by analyzing the variable importance in projection data to determine if a variable within the first recorded data matrix can be eliminated as having minimal impact on the first endpoint signal matrix.

25. The apparatus according to claim 17, wherein said detecting section is configured to sequentially detect electrical signal data relating to the etch process within said etching reactor.

26. The apparatus according to claim 17, wherein said detecting section is configured to sequentially detect match network capacitor setting data relating to the etch process within said etching reactor.

* * * * *